(12) United States Patent
Kim et al.

(10) Patent No.: US 7,033,457 B2
(45) Date of Patent: Apr. 25, 2006

(54) METHOD OF ATTACHING OPTICAL WAVEGUIDE COMPONENT TO PRINTED CIRCUIT BOARD

(75) Inventors: Young-Woo Kim, Chungnam (KR); Young-Sang Cho, Chungbuk (KR); Dek-Gin Yang, Chungbuk (KR); Kyu-Hyok Yim, Chungbuk (KR)

(73) Assignee: Samsung Electro-Mechanics Co., Ltd., Kyonggi-Do (KR)

( * ) Notice: Subject to any disclaimer, the term of this patent is extended or adjusted under 35 U.S.C. 154(b) by 0 days.

(21) Appl. No.: 11/126,676

(22) Filed: May 11, 2005

(65) Prior Publication Data

US 2005/0205201 A1    Sep. 22, 2005

Related U.S. Application Data

(62) Division of application No. 10/414,669, filed on Apr. 16, 2003.

(30) Foreign Application Priority Data

Aug. 16, 2002    (KR) .................. 10-2002-0048601

(51) Int. Cl.
*B32B 37/00*    (2006.01)
*G02B 6/00*    (2006.01)

(52) U.S. Cl. .................. 156/257; 156/268; 156/293; 156/298; 156/513; 385/14; 29/830; 174/250

(58) Field of Classification Search ................ 156/153, 156/257, 268, 272.8, 293, 298, 513, 514; 385/14; 29/830; 174/250
See application file for complete search history.

(56) References Cited

U.S. PATENT DOCUMENTS 6,882,762 B1 *    4/2005    Brist et al. ................ 385/14

FOREIGN PATENT DOCUMENTS

JP    2002-258088    *    9/2002
JP    2003-215374    *    7/2003

* cited by examiner

*Primary Examiner*—Linda Gray
(74) *Attorney, Agent, or Firm*—Gottlieb, Rackman & Reisman, P.C.

(57) ABSTRACT

Disclosed is a method of attaching an optical waveguide component to a printed circuit board, which is a double-sided or a multilayer printed circuit board, through pre-bonding and main-bonding by use of an adhesive tape. Prior to being attached to the printed circuit board, the optical waveguide component is preferably subjected to a plasma surface treatment to give a surface roughness thereto. The present method is advantageous in that the optical waveguide component can be attached to the printed circuit board with improved flatness and precise alignment without causing chemical or thermal damage to the optical waveguide component.

10 Claims, 6 Drawing Sheets

METHOD OF ATTACHING OPTICAL WAVEGUIDE COMPONENT TO PRINTED CIRCUIT BOARD

This application is a division of U.S. Ser. No. 10/414,669 filed Apr. 16, 2003, the contents of which are incorporated herein by reference.

BACKGROUND OF THE INVENTION

1. Field of the Invention

The present invention relates to a method of attaching an optical waveguide component to a printed circuit board. More particularly, the present invention is directed to a method of attaching an optical waveguide component to a printed circuit board, which enables improved flatness and precise alignment of the optical waveguide component without chemical or thermal damage to the optical waveguide component upon attaching.

2. Description of the Prior Art

As well known to those skilled in the art, when components are electrically connected with each other, or power voltage or ground voltage is supplied in large-scaled devices such as a computer, an electric signal is conventionally applied through conductive copper patterns laminated on a printed circuit board to form at least one electric circuit on an inner and outer layer of the printed circuit board. Meanwhile, nowadays, there is a need for a broad bandwidth and a high-speed signal processing in order to cope with an increased data traffic and transmission according to a rapid increase of use of the Internet and improved service on the Internet. However, the electric signal is subject to a restriction attributable to electro magnetic susceptibility (EMS) during a high speed switching within a giga band, and thus an optically interfacing medium is inevitably required.

To solve this problem, efforts have been made to develop an electro-optical circuit board (EOCB), in which both an electric signal and an optical signal are propagated in such a way that an ultra high-speed data communication is interfaced with the optical signal, and a data storage and a signal processing are conducted with the electric signal in the component on one substrate. For this, an optical waveguide and a glass plate are embedded in the printed circuit board with a copper layer patterned in a predetermined manner.

In this regard, U.S. Pat. Pub. No. 2002-51599 discloses an optical-electrical wiring board comprising an electrical wiring board having a through-hole formed therein and an optical wiring layer laminated on said electrical wiring board and including a core through which the light is propagated and a clad surrounding said core. However, this patent is disadvantageous in that the optical wiring layer is directly formed on the backside of the electrical wiring board, which makes the application to a multilayer printed circuit board difficult, and thus lowering optically interfacing properties.

Meanwhile, in manufacturing the EOCB, an initial setting is important because a wiring and an array on an outer layer of the printed circuit board depend on the attachment position of the optical waveguide component to the printed circuit board.

Furthermore, since a polymer employable for an optical waveguide component is different from a material constituting the printed circuit board, the delamination and air voids may occur at an interface between the optical waveguide component and the printed circuit board.

In the light of the above, there still remains a need to develop a method of to improve the bondability and the alignment of the optical waveguide component to the printed circuit board to lessen the loss of an optical signal transmitted to a via hole.

SUMMARY OF THE INVENTION

The present inventors have conducted extensive studies to avoid the above disadvantages, resulting in the finding that the optical waveguide component can be attached to the printed circuit board through the steps of pre-bonding and main-bonding with improved flatness and precise alignment of the optical waveguide component without chemical or thermal damage to the optical waveguide component upon attaching, by use of an adhesive tape (and/or by use of a groove formed on or in the printed circuit board), for receiving the optical waveguide component.

Therefore, an object of the present invention is to provide a method of attaching an optical waveguide component to a printed circuit board, which enables improved flatness and precise alignment of the optical waveguide component without chemical or thermal damage to the optical waveguide component upon attaching.

According to a first aspect of the present invention, there is provided a method of attaching an optical waveguide component to a printed circuit board, which comprises:

patterning an upper conductive layer of the printed circuit board by a photoresist/etching process to form a groove for receiving the optical waveguide component;

providing the optical waveguide component on which a surface roughness is exhibited;

positioning the optical waveguide component in the groove with an adhesive tape interposed therebetween, followed by pre-bonding through a hot press to form a pre-bonded structure; and main-bonding the pre-bonded structure by pressing under the conditions of a predetermined temperature and pressure.

According to a second aspect of the present invention, there is provided a method of attaching an optical waveguide component to a printed circuit board having a plurality of conductive layers and dielectric layers, which comprises:

counter-bowling the printed circuit board in a level-differentiating mode along the predetermined pattern to form a groove for receiving the optical waveguide component, with one of the dielectric layers being exposed in the groove and with the exposed dielectric layer having reduced thickness compared with the original thickness thereof to a degree that no residue of conductive layer substantially remains on the exposed dielectric layer;

providing the optical waveguide component on which a surface roughness is exhibited;

positioning the optical waveguide component in the groove with an adhesive tape layer interposed therebetween, followed by pre-bonding through a hot press to form a pre-bonded structure; and main-bonding the pre-bonded structure by pressing under the condition of a predetermined temperature and pressure.

According to a third aspect of the present invention, there is provided a method of attaching an optical waveguide component to a printed circuit board having a plurality of conductive layers and dielectric layers, which comprises:

counter-bowling the printed circuit board in a level-differentiating mode along the predetermined pattern to expose one of the dielectric layers within the patterned region, in which the exposed dielectric layer has so reduced thickness compared with the original thickness thereof as to be capable of being substantially removed in the subsequent step;

selectively removing the exposed dielectric layer by use of laser to expose a lower conductive layer in contact therewith, thereby forming a groove for receiving the optical waveguide component;

providing the optical waveguide component on which a surface roughness is exhibited;

positioning the optical waveguide component in the groove with an adhesive tape layer interposed therebetween, followed by pre-bonding through a hot press to form a pre-bonded structure; and main-bonding the pre-bonded structure by pressing under the condition of a predetermined temperature and pressure.

According to a fourth aspect of the present invention, there is provided a method of attaching an optical waveguide component to a printed circuit board, which comprises:

providing the printed circuit board;

providing the optical waveguide component on which a surface roughness is exhibited;

positioning the optical waveguide component on an upper conductive layer of the printed circuit board with an adhesive tape layer interposed therebetween, followed by pre-bonding through a hot press to form a pre-bonded structure; and main-bonding the pre-bonded structure by vacuum pressing under the condition of a predetermined temperature and pressure in an autoclave.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1A:
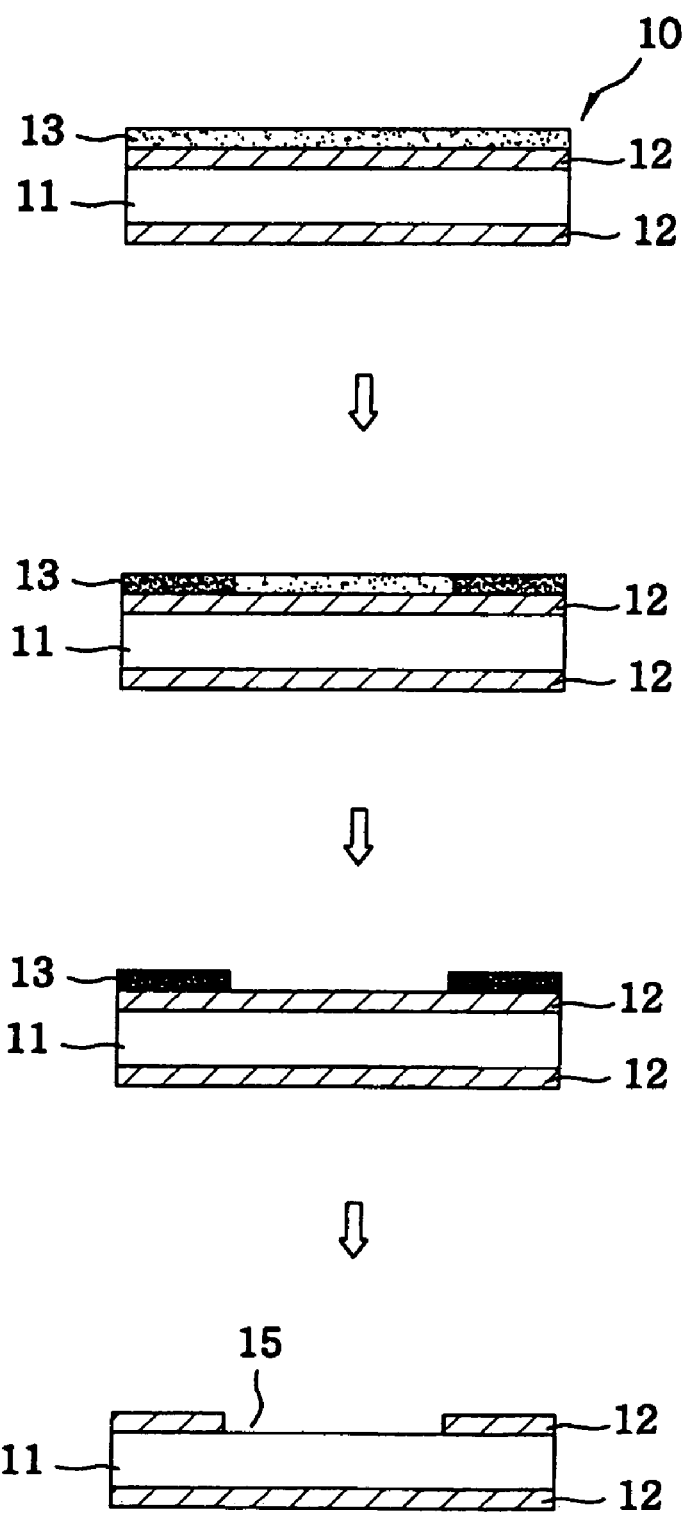
FIG. 1a shows sectional views illustrating a formation embodiment of a groove in an upper conductive layer of a printed circuit board by the steps of dry film coating, exposing/developing and etching in accordance with a first aspect of the present invention.

The present invention provides a method of attaching an optical waveguide component to a printed circuit board, which enables improved flatness and precise alignment of the optical waveguide component without chemical or thermal damage to the optical waveguide component upon attaching.

Examples of the printed circuit board employable in the present invention include a double-sided printed circuit board having one dielectric substrate layer and two circuit layers, and a multilayer printed circuit board consisting of plural dielectric layers and circuit layers. As such, the dielectric layer may be a dielectric substrate layer or a dielectric adhesive layer.

It is well known in the art that the dielectric adhesive layer is employed for laminating a plurality of layers constituting a multilayer printed circuit board. In general, film-typed dielectric adhesive, which is referred to as a prepreg, is widely used in such laminating procedures.

The circuit layer refers to a conductive layer of the printed circuit board. As for the circuit layer, at least one circuit is formed to electrically connect components with each other, or to supply power voltage or ground voltage in large-scaled devices such as a computer. In addition, the circuit layer includes a conductive body constituting the printed circuit, that is to say, an electric circuit. The conductive body refers to an electrically conductive region of the circuit layer of the printed circuit board. Examples of the conductive body include a line, a land (a region in which an electric member such as an IC, a capacitor or a resistor is connected to the printed circuit board), a via hole (a metal-plated hole for electrically connecting two or more circuit layers to each other), and a spherical ring. The spherical ring refers to a conductive body covering the via hole on the circuit layer. Generally, the circuit layer of the printed circuit board is formed on a material covering a panel by a photoresist/etching process. Hereinafter, the dielectric layer containing at least one circuit layer of the printed circuit board positioned on a surface thereof will be termed as a treated panel.

Meanwhile, a multilayer printed circuit board is typically manufactured by laminating at least two treated panels containing the circuit layers positioned on both sides thereof. The treated panels are generally laminated by use of prepreg. The prepreg, which is partially hardened glass-epoxy film, is suitable for manufacturing the printed circuit board containing a glass-epoxy substrate. As such, optionally, the treated panel may be treated with a material promoting attaching of the circuit layer to the prepreg. A stack of a plurality of the treated panel and the prepreg is positioned on a die. As a result, the circuit layer acts as a top and bottom layers of the stack. Next, the predetermined heat and pressure are applied to the die for lamination. Thereafter, a prepreg and a conductive layer (e.g. copper layer) are formed in order on each of the outer sides of the laminated structure, followed by a conventional processing for double-sided printed circuit board or a similar process thereto for forming a multilayer printed circuit board.

The dielectric substrate layer can be selected from the group consisting of a resin impregnated fiber glass cloth such as an epoxy impregnated woven glass mat (glass-epoxy), polyimide, FR-4, resincyanate ester, teflon (PTFE), polyethylene ether, and a combination thereof.

FIG. 1a shows sectional views illustrating a formation embodiment of a groove in an upper conductive layer of a printed circuit board by the steps of dry or photoresist film coating, exposing/developing and etching in accordance with a first aspect of the present invention.

With reference to FIG. 1a, an upper conductive layer 12 (e.g. copper layer) of a printed circuit board 10 is patterned by the conventional photoresist/etching process to form a groove 15 for receiving an optical waveguide component 20.

As such, the printed circuit board may be a double sided or a multilayer printed circuit board.

In detail, a photoresist or dry film 13 is coated on the upper conductive layer 12 of the printed circuit board 10. Then, the coated printed circuit board is exposed to light and dipped into a photoresist developing liquid to dissolve an unnecessary portion of photoresist film to expose a certain portion of the conductive layer 12. The resulting structure is dipped into an etching liquid to chemically etch the exposed portion of conductive layer 12 to form the groove 15 for receiving the optical waveguide component 20 in the upper conductive layer 12 of the printed circuit board 10.

Figure 1B:
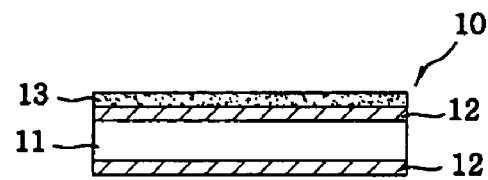
FIG. 1b shows sectional views illustrating another formation embodiment of a groove in an upper conductive layer of a printed circuit board by the steps of dry film coating, exposing/developing, conductive metal plating, and etching in accordance with the first aspect of the present invention.
Figure 1B:
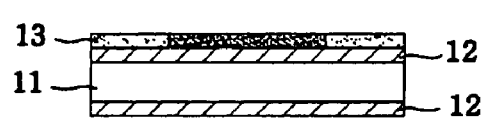
Figure 1B:
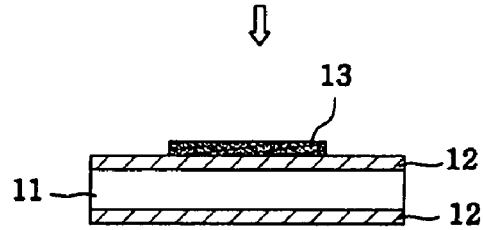
Figure 1B:
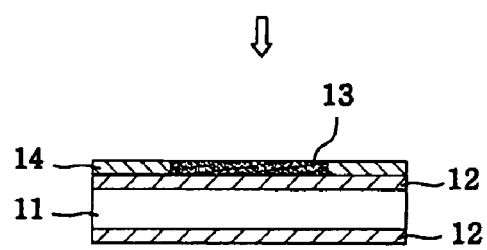
Figure 1B:
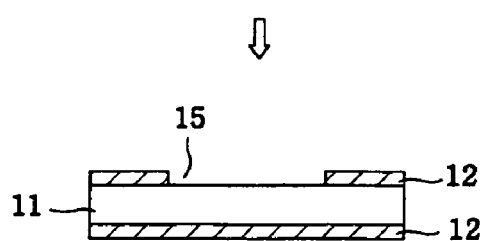

FIG. 1b shows sectional views illustrating another formation embodiment of a groove in an upper conductive layer of a printed circuit board by the steps of dry film coating, exposing/developing, conductive metal plating and etching in accordance with the first aspect of the present invention.

With reference to FIG. 1b, the photoresist or dry film 13 is coated on the upper conductive layer 12 (e.g. copper layer) of the printed circuit board 10. Then, the coated printed circuit board is exposed to light and dipped into a photoresist developing liquid to dissolve a certain portion of the photoresist or dry film 13 which will be plated with conductive metal such as copper. The conductive metal plated layer 14 is formed on the portion in which the dry film has been removed, and the resulting structure is dipped into an etching liquid to chemically etch the photoresist or dry film 13, a portion of conductive layer 12 corresponding to the area of the photoresist or dry film, and the conductive metal plated layer 14 to form the groove 15 for receiving the optical waveguide component 20 in the upper conductive layer 12 of the printed circuit board 10.

Figure 2:
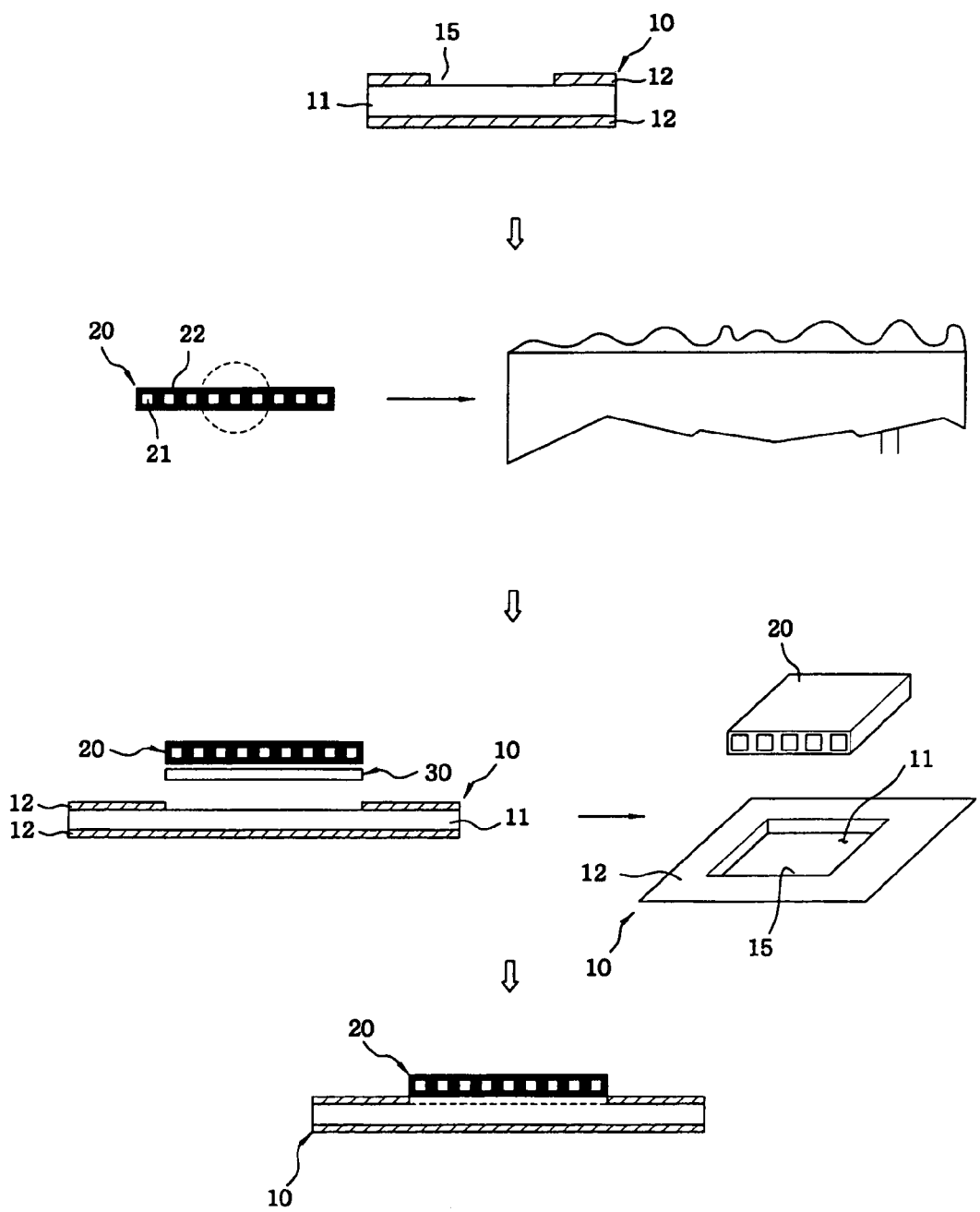
FIG. 2 illustrates an attaching scheme of an optical waveguide component to a printed circuit board in accordance with the first aspect of the present invention.

FIG. 2 illustrates an attaching scheme of an optical waveguide component to a printed circuit board in accordance with the first aspect of the present invention.

With reference to FIG. 2, preferably, a surface of the optical waveguide component 20 is physically and chemically treated by plasma to provide a surface roughness for the subsequent attachment of the optical waveguide component 20 and the printed circuit board 10, prior to being embedded into the groove 15. Preferably, the surface of the optical waveguide component 20 exhibits a surface roughness of about 30 to 300 Å. Generally, such an optical waveguide component 20 consists of a core 21 and a clad layer 22, and the core 21 is surrounded with the clad layer 22.

Then, the plasma-treated optical waveguide component 20 is positioned within the groove 15 in the conductive layer 12 of the printed circuit board 10, along with an adhesive tape 30 (preferably, a thermosetting adhesive tape). In this case, the adhesive tape 30 is interposed between the optical waveguide component and the printed circuit board.

Next, a pre-bonding is preformed through a hot press, thereby avoiding a dislocation of the optical waveguide component.

The pre-bonded structure is main-bonded by pressing at a predetermined temperature and under a predetermined pressure. The main-bonding condition depends on an area of the used printed circuit board and a type of the adhesive tape.

The main-bonding step as described above may be conducted by pressurization or by vacuum pressurization using an autoclave.

Figure 3:
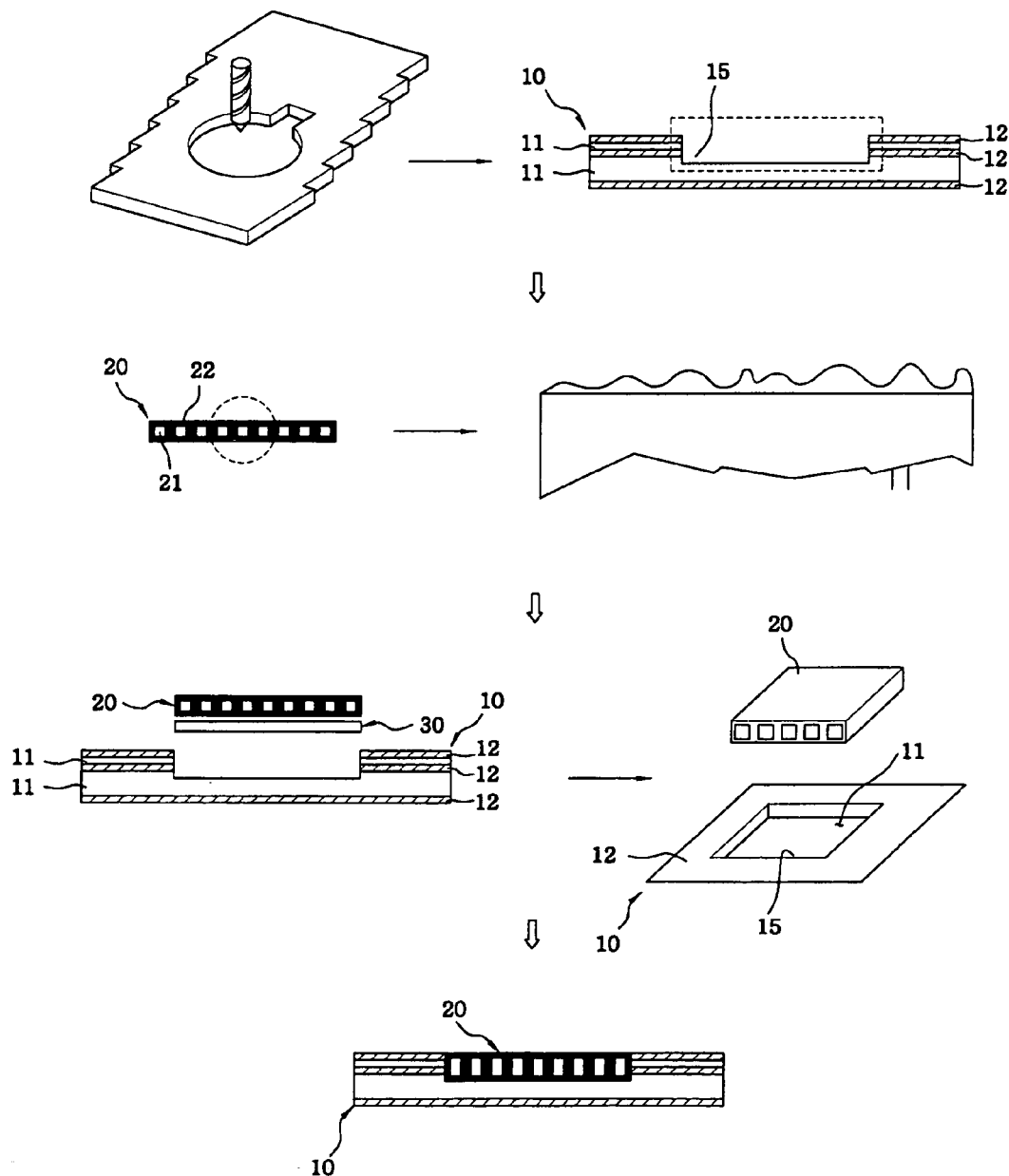
FIG. 3 illustrates an attaching scheme of an optical waveguide component to a printed circuit board in accordance with a second aspect of the present invention.

Turning now to FIG. 3, illustrated is attaching scheme of an optical waveguide component to a printed circuit board according to a second aspect of the present invention. In this case, the printed circuit board 10 is preferably a multilayer printed circuit board having a plurality of dielectric layers 11 and conductive layers 12. Firstly, the printed circuit board 10 is subjected to counter-bowling in a level-differentiating mode by the predetermined pattern to form a groove 15 for receiving the optical waveguide component 20. The counter-bowling step is carried out in such a manner that one of the dielectric layers 11 is exposed in the groove 15, and the exposed dielectric layer has reduced thickness compared with the original thickness thereof to a degree that no residue of conductive layer 12 substantially remains on the exposed dielectric layer. Then, an optical waveguide component, on which a plasma surface treatment has been conducted to give a surface roughness, is positioned in the groove 15. At this time, an adhesive tape layer 30 is interposed between the optical waveguide component 20 and the printed circuit board 10 as explained earlier. The subsequent pre-bonding and main-bonding steps may be conducted in the same manner as described above to manufacture the final printed circuit board to which the optical waveguide component is attached.

In this embodiment, the height of the groove 15 should be the same as a total sum of a height of the optical waveguide component 20 and a height of the adhesive tape 30 for flatness of the final structure.

Figure 4:
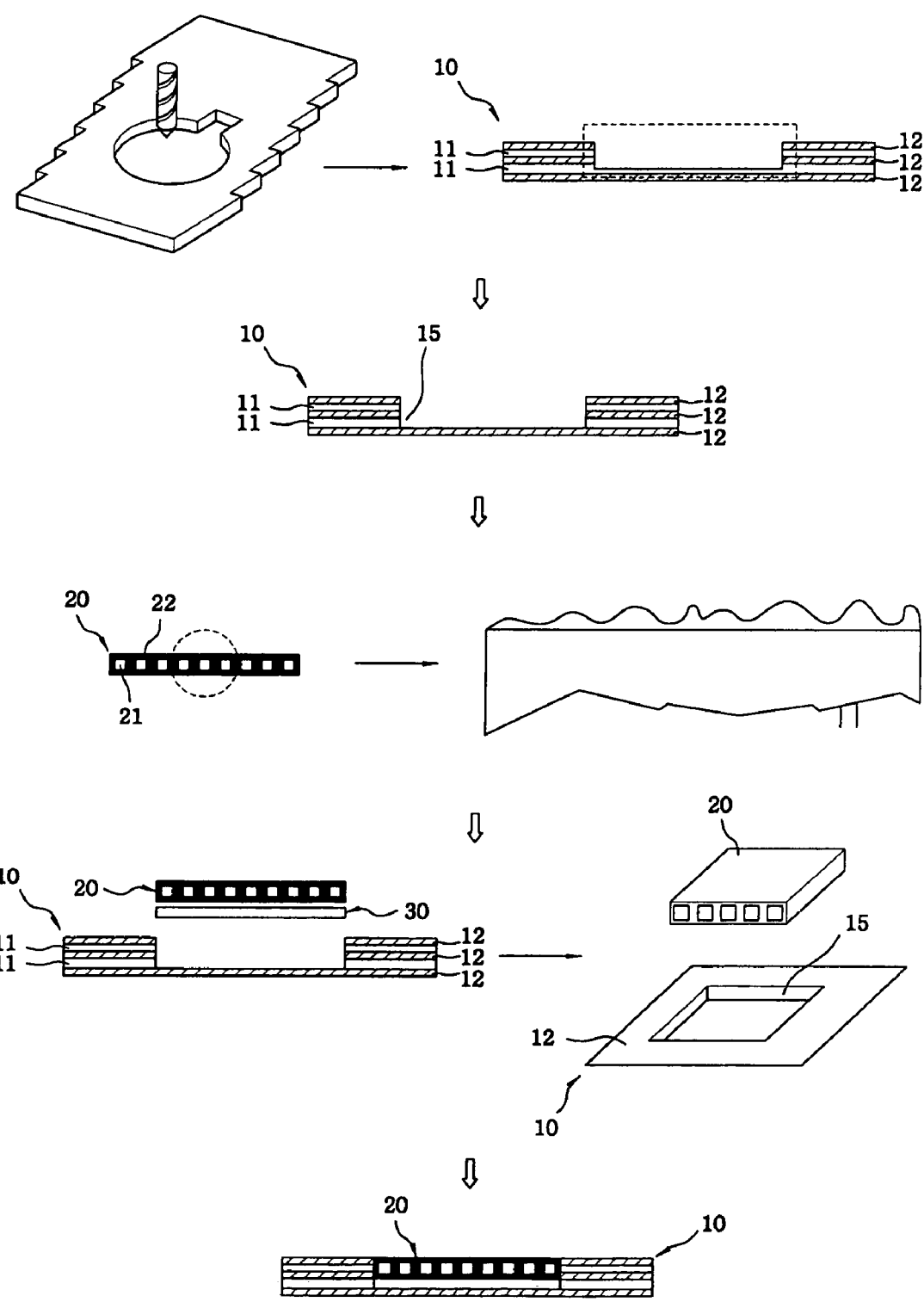
FIG. 4 illustrates an attaching scheme of an optical waveguide component to a printed circuit board in accordance with a third aspect of the present invention.

FIG. 4 illustrates an attaching scheme of an optical waveguide component to a printed circuit board in accordance with a third aspect of the present invention.

In FIG. 4, the printed circuit board 10 is preferably a multilayer printed circuit board having a plurality of dielectric layers 11 and conductive layers 12 as in the second aspect of the present invention. Firstly, the printed circuit board 10 is subjected to counter-bowling in a level-differentiating mode by the predetermined pattern. The counter-bowling step is performed until one of the dielectric layers 11 is exposed within the patterned region. Within the region exposed by counter-bowling, the thickness of the exposed dielectric layer should be less than the original thickness thereof. As such, the reduced thickness of the dielectric layer should be in the range that the exposed dielectric layer is capable of being substantially removed by the subsequent laser processing. Next, the exposed dielectric layer having the reduced thickness is subjected to laser processing to form a groove 15 for receiving the optical waveguide component 20. As a result of selective laser processing, a lower conductive layer in the groove 15 is exposed. Preferably, the laser processing is conducted using a $CO_2$ type laser beam at about 9400 nm. Thereafter, the positioning step of the optical waveguide component 20 into the groove 15, the pre-bonding step and the main-bonding step are conducted sequentially in the same manner as described earlier. Of course, prior to being embedded, the optical waveguide component 20 is surface-treated by plasma to give a surface roughness thereto as described above. The height of the groove 15 should also be the same as a total sum of a height of the optical waveguide component 20 and a height of the adhesive tape 30 for flatness of the final structure.

Figure 5:
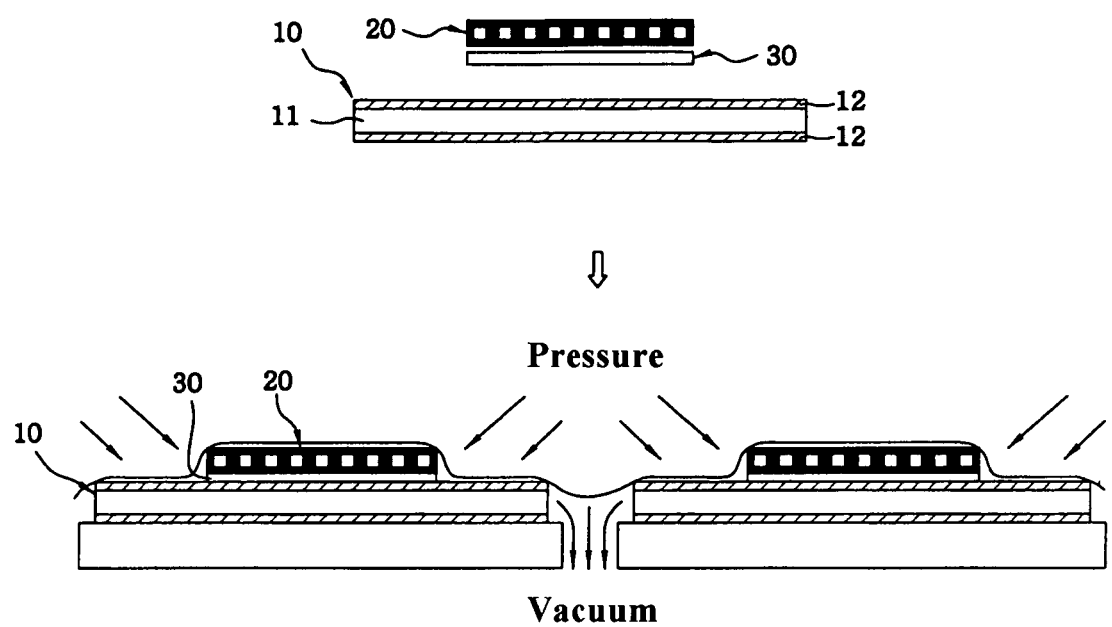
FIG. 5 illustrates an attaching scheme of an optical waveguide component to a printed circuit board in accordance with a fourth aspect of the present invention.

FIG. 5 illustrates an attaching scheme of an optical waveguide component to a printed circuit board in accordance with a fourth aspect of the present invention.

With reference to FIG. 5, the printed circuit board 10 is illustrated as a double-sided one, however it should be noted that a multilayer printed circuit board can be employed. In this embodiment, the groove formation as mentioned in the previous embodiment is not required. Firstly, the surface-treated optical waveguide component 20 is positioned onto a particular region of the upper conductive layer 12 of the printed circuit board 10 by use of the adhesive tape 30. The adhesive layer 30 is interposed between the printed circuit board 10 and the optical waveguide component 20. Then, a pre-bonding step is carried out through a hot press, thus forming a pre-bonded structure. The pre-bonded structure is subjected to main-bonding by vacuum pressing under the condition of a predetermined temperature and pressure in an autoclave. An exemplary embodiment of the vacuum pressurization is schematically illustrated in FIG. 5.

In accordance with the present invention, the attaching process is divided into a pre-bonding and a main-bonding step by use of an adhesive tape, whereby improved flatness and precise alignment of the optical waveguide component may be attained without chemical or thermal damage to the optical waveguide component upon attaching.

The printed circuit board having the embedded optical waveguide component according to the present invention may efficiently and reliably transceive signals in form of light without an electromagnetic interference (EMI), thus being applied as a backplane and a daughter board to devices such as switches of networks and transceivers, switches and servers of datacom, communication devices of aerospace and avionics fields, UMTS mobile phone (universal mobile telephone system) based on a station, high-end enterprise computer servers, main-frame/super computers, and high-end computer auxiliary devices.

It should also be understood that the foregoing relates to only the scope of the invention is defined by the appended claims rather than by the description preceding them, and all changes that fall within meets and bounds of the claims, or equivalence of such meets and bounds are therefore intended to be embraced by the claims.

What is claimed is:

1. A method of attaching an optical waveguide component to a printed circuit board, which comprises:
   patterning an upper conductive layer of the printed circuit board to form a groove for receiving the optical waveguide component;
   providing the optical waveguide component on which a surface roughness is exhibited;
   positioning the optical waveguide component in the groove along with an adhesive tape layer, the adhesive tape layer being interposed between the optical waveguide component and the groove, followed by pre-bonding through a hot press to form a pre-bonded structure; and
   main-bonding the pre-bonded structure by pressing under the conditions of a predetermined temperature and pressure.

2. The method as defined in claim 1, wherein the printed circuit board is a double-sided printed circuit board or a multilayer printed circuit board.

3. The method as defined in claim 1, wherein the surface roughness is in the range of 30 to 300 Å.

4. The method as defined in claim 1, wherein the main-bonding step is conducted by pressurization or by vacuum pressurization using an autoclave.

5. A method of attaching an optical waveguide component to a printed circuit board, which comprises:
   providing the printed circuit board having a groove;
   providing the optical waveguide component on which a surface roughness is exhibited;
   positioning the optical waveguide component in the groove along with an adhesive tape layer, the adhesive tape layer being interposed between the optical waveguide component and the groove, followed by pre-bonding through a hot press to form a pre-bonded structure; and
   main-bonding the pre-bonded structure by vacuum pressing under the condition of a predetermined temperature and pressure in an autoclave.

6. The method as defined in claim 5, wherein the surface roughness is in the range of 30 to 300 Å.

7. The method as defined in claim 5, wherein the printed circuit board is a double-sided printed circuit board or a multilayer printed circuit board.

8. The method as defined in claim 1, wherein the upper conductive layer is patterned by a photoresist/etching process.

9. The method as defined in claim 1, wherein the surface roughness is formed by a plasma surface treatment.

10. The method as defined in claim 5, wherein the surface roughness is formed by a plasma surface treatment.

* * * * *